United States Patent
Deutsch et al.

(10) Patent No.: US 10,732,221 B2
(45) Date of Patent: Aug. 4, 2020

(54) SIGNAL TRACING USING ON-CHIP MEMORY FOR IN-SYSTEM POST-FABRICATION DEBUG

(71) Applicant: DUKE UNIVERSITY, Durham, NC (US)

(72) Inventors: Sergej Deutsch, Austin, TX (US); Krishnendu Chakrabarty, Chaphel Hill, NC (US)

(73) Assignee: DUKE UNIVERSITY, Durham, NC (US)

( * ) Notice: Subject to any disclaimer, the term of this patent is extended or adjusted under 35 U.S.C. 154(b) by 41 days.

(21) Appl. No.: 15/633,486

(22) Filed: Jun. 26, 2017

(65) Prior Publication Data

US 2017/0299655 A1     Oct. 19, 2017

Related U.S. Application Data

(63) Continuation of application No. 14/461,528, filed on Aug. 18, 2014, now Pat. No. 9,720,036.

(51) Int. Cl.
   *G01R 31/317*   (2006.01)
   *G06F 11/34*    (2006.01)
   *G06F 11/36*    (2006.01)

(52) U.S. Cl.
   CPC .  *G01R 31/31705* (2013.01); *G01R 31/31703* (2013.01); *G06F 11/348* (2013.01); *G06F 11/3636* (2013.01)

(58) Field of Classification Search
   CPC ...... G01R 31/318547; G01R 31/31705; G06F 11/348
   See application file for complete search history.

(56) References Cited

U.S. PATENT DOCUMENTS

| | | | |
|---|---|---|---|
| 5,506,959 A | | 4/1996 | Cockburn |
| 5,517,442 A | | 5/1996 | Kirihata et al. |
| 5,568,380 A | | 10/1996 | Brodnax et al. |
| 5,590,354 A | | 12/1996 | Klapproth et al. |
| 5,615,335 A | * | 3/1997 | Onffroy ................. G11C 29/12 714/25 |
| 5,713,008 A | * | 1/1998 | Falkner ............... G06F 11/3476 711/118 |

(Continued)

OTHER PUBLICATIONS

Xu, Q. and Liu, X., "On Signal Tracing in Post-Silicon Validation," 15th Asia and South Pacific Design Automation Conference (ASP-DAC), Jan. 18-21, 2010, IEEE, pp. 262-267.

(Continued)

*Primary Examiner* — Steve N Nguyen
(74) *Attorney, Agent, or Firm* — Talem IP Law, LLP

(57) ABSTRACT

A post-fabrication debug and on-line error checking framework for 2D- and 3D-ICs with integrated memories is described. A design-for-debug (DfD) architecture can include, for an IC with on-chip memory, a debug module connected to a functional bus of the IC. The debug module receives trace data for an interval, generates compact signatures based on the received data, and compares these signatures to expected signatures. Intervals containing erroneous trace data can be identified by the debug module and stored in on-chip memory. A single iteration of signal tracing for debug testing between automated test equipment and the IC is possible.

11 Claims, 7 Drawing Sheets

(56) References Cited

U.S. PATENT DOCUMENTS

| | | | | |
|---|---|---|---|---|
| 5,860,003 | A * | 1/1999 | Eidler | G06F 9/4843 710/5 |
| 5,914,967 | A | 6/1999 | Yomtoubian | |
| 6,008,821 | A * | 12/1999 | Bright | G06T 1/20 345/504 |
| 6,069,037 | A | 5/2000 | Liao | |
| 6,577,640 | B2 * | 6/2003 | Mansouri | H04N 21/226 370/381 |
| 7,657,807 | B1 * | 2/2010 | Watkins | G01R 31/318594 714/718 |
| 8,286,042 | B2 * | 10/2012 | Gangasani | G01R 31/318385 714/30 |
| 8,688,877 | B1 * | 4/2014 | Lee | G11C 7/1075 710/71 |
| 2004/0107395 | A1 * | 6/2004 | Volkerink | G01R 31/31705 714/732 |
| 2005/0083743 | A1 | 4/2005 | Andrei et al. | |
| 2008/0077835 | A1 * | 3/2008 | Khoche | G01R 31/31724 714/733 |
| 2012/0226942 | A1 * | 9/2012 | Gangasani | G06F 11/27 714/30 |
| 2013/0111123 | A1 * | 5/2013 | Thayer | G06F 13/16 711/105 |
| 2013/0326281 | A1 | 12/2013 | Xu et al. | |
| 2015/0113348 | A1 * | 4/2015 | Douskey | G01R 31/318547 714/732 |

OTHER PUBLICATIONS

Yang, J.-S. and Touba, N. A., "Improved Trace Buffer Observation via Selective Data Capture Using 2-D Compaction for Post-Silicon Debug," IEEE Transactions on Very Large Scale Integration (VLSI) Systems, vol. 21, No. 2, Feb. 2013, pp. 320-328.

Daoud, E. A. and Nicolici, N., "On Using Lossy Compression for Repeatable Experiments during Silicon Debug," IEEE Transactions on Computers, vol. 60, No. 7, Jul. 2011, pp. 937-950.

Mijat, R., "Better Trace for Better Software," ARM, White Paper, 2010, 12 pages.

* cited by examiner

SIGNAL TRACING USING ON-CHIP MEMORY FOR IN-SYSTEM POST-FABRICATION DEBUG

CROSS-REFERENCE TO RELATED APPLICATION

This application is a continuation of U.S. Ser. No. 14/461,528, filed on Aug. 18, 2014.

This invention was made with government support under Federal Grant No. CCF-1017391 awarded by the National Science Foundation. The government has certain rights in the invention.

BACKGROUND

Modern CMOS technology has enabled the integration of hundreds of components in a single silicon chip. Recent advances in three-dimensional (3D) stacking of integrated circuits (ICs) and other components using through-silicon vias (TSVs) promise even denser integration in a single package. The production process flow generally involves pre-fabrication (or "pre-silicon") simulations, followed by post-fabrication (or "post-silicon") debug and validation. Despite steady progress in pre-silicon verification methods and tools, first silicon—the initial run of a fabrication process for a particular design—is rarely bug-free. However, the post-silicon debug of such highly integrated systems is one of the major challenges for the feasibility of commercial systems.

Post-fabrication/post-silicon debug requires a relatively large engineering effort, accounting for a significant portion of the total time-to-market of the silicon product and this portion has been projected to grow. In order to keep pace with advances in system-level integration, including 3D stacking, traditional methodologies for bug localization need to be improved.

BRIEF SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A post-fabrication debug framework for 2D- and 3D-ICs with integrated memories is described. A design-for-debug (DfD) architecture can include, for an IC with on-chip memory, a debug module connected to a functional bus of the IC. The debug module receives trace signals for an interval, generates a compact signature as a function of the received trace signals, and compares this signature to expected signature. Intervals containing erroneous trace data can be identified by the debug module and stored in on-chip memory; whereas intervals containing only valid trace data are discarded.

A single iteration of test equipment sending test signals for a particular trace to a circuit under test can be sufficient to perform debug. The test equipment can load test data and expected signatures into the on-chip memory of the circuit under test. Then, once the debug module is activated by the test equipment, the testing occurs (and is executed) on-chip using the expected signatures and test data. The test equipment can simply read the identified erroneous trace data from the on-chip memory once the test is completed.

The techniques described herein can be applied both in-field during platform debug and system operation and on automatic test equipment (ATE) during functional test execution. The captured data of the failing units can also be stored for offline analysis.

In addition to post-silicon debug, this technique can be used for on-line error checking. During a functional-program execution, a set of internal signals can be monitored and checked for errors by comparing generated compact signatures with the expected ones. Once an error is detected, the system can then perform error recovery.

BRIEF DESCRIPTION OF THE DRAWINGS

FIG. 11 shows a table providing a comparison of debug session time between the example implementation and the Selective Capture Method.

FIG. 12 shows a table providing a comparison of debug session time between the example implementation and the Lossy Compression Method.

DETAILED DISCLOSURE

Figure 1:
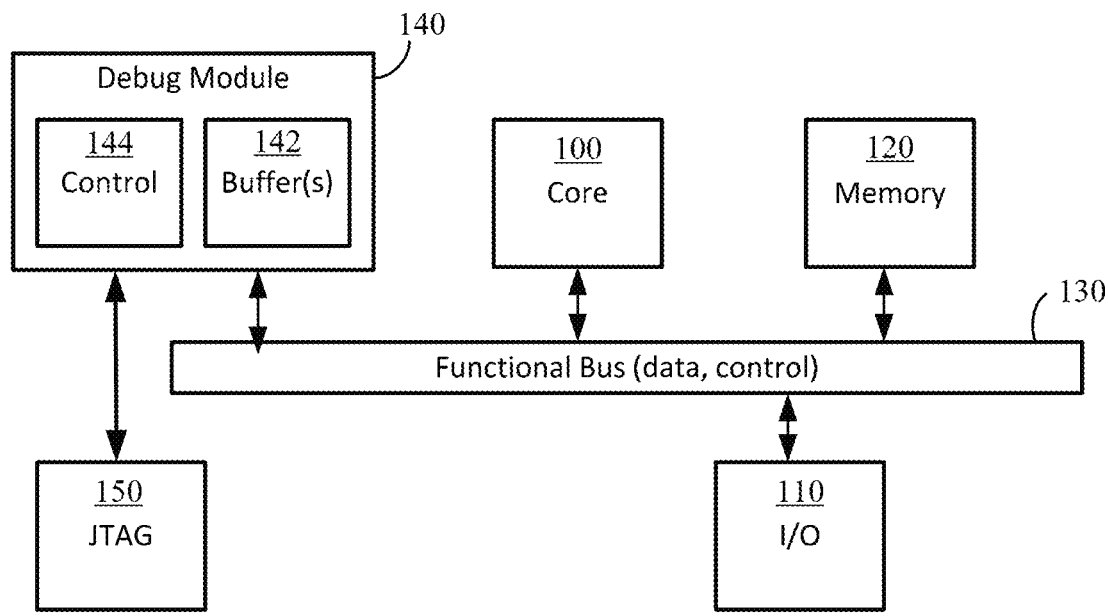
FIG. 1 illustrates a system-on-a-chip (SoC) having debug architecture for implementing the techniques described herein.

A post-fabrication debug framework for 2D- and 3D-ICs with integrated memories is described. Examples of such ICs include, but are not limited to 3D-ICs with dynamic random access memory (DRAM) integrated according to JEDEC Wide I/O standards or Hybrid Memory Cube (HMC), and 2D ICs with embedded DRAM, such as eDRAM. These integrated memories may be referred to as on-chip memories and are often used as system memories.

On-chip memory of 2D- and 3D-ICs is exploited to enable a larger observation window for post-fabrication debug signal tracing than is available from a trace buffer used in numerous signal tracing techniques. Signal tracing refers to a debug technique that follows, or "traces", internal signal paths of an IC during the circuit's normal operation in order to find bugs—errors in the circuit's design (and functionality). An observation window refers to the amount of data that can be extracted from a given debug session. Increasing the observation window increases the amount of data available for a given debug session. To handle an observation window that is greater than the capacity of a trace buffer, the described framework divides the entire observation window for a particular debug session into intervals.

A debug module of a 2D- or 3D-IC receives trace signals for an interval, generates a compact signature as a function of the received trace signals, and compares this signature to an expected signature. Intervals containing erroneous trace data can be identified by the debug module by this comparison and stored in on-chip memory during run-time. The intervals containing erroneous trace data (e.g., erroneous bits) are identified by the debug module by comparing their signature with pre-calculated expected "golden" signatures that are stored in the on-chip memory a priori. Failing intervals (and their associated time stamp) are stored into the on-chip memory during the run-time process whereas valid intervals are not stored, which allows for a more efficient use of the memory, resulting in a larger observation window. A valid interval refers to an interval that satisfies the conditions of the comparison with the golden signatures (e.g., is a match within an allowable tolerance or some other condition that indicates no fault with the trace).

An IC chip can include both design-for-test (DfT) and design-for-debug (DfD) structures. DfT structures include scan chains and core test wrappers. DfD structures include those that support hardware triggers and core internal signals' observation. Hardware triggers may be implemented with comparators and/or counters. During a post-fabrication debug process, signals are applied to the chip and the system is operated under a normal functional node. Once a trigger condition is hit, a particular signal path being traced is transferred as captured data to an internal trace buffer. Trigger conditions and the particular signal being traced can be adjusted during the silicon debug process to garner the appropriate information.

The techniques and debug architectures described herein do not require multiple iterations or intermediate processing steps. Further, the described debug techniques can be applied during functional testing to observe a set of any number of internal signals with minimum time overhead associated with the upload of golden signatures and the download of stored debug data to external equipment. The data acquired in this manner can be processed offline for the identification of systemic defects.

In addition to carrying out debug during functional testing, the described debug architecture is suitable for on-line error checking. During a functional-program execution, a set of internal signals can be monitored and checked for errors by comparing generated compact signatures with the expected ones. Once an error is detected, the system can then perform error recovery. While JTAG pins may be used to access the debug module for testing on automated test equipment, on-line error checking capabilities are available for implementations in which a chip is designed with functional logic to access and control the debug module. In addition, the instruction set of an on-chip microprocessor can be extended to enable programming of the debug module through a functional program.

FIG. 1 illustrates a system-on-a-chip (SoC) having debug architecture for implementing the techniques described herein. The SoC may be implemented as a 2D-IC, a 3D-IC, a system in a package (SiP), or some combination thereof. Referring to FIG. 1, a SoC can include one or more processor cores 100, input/output (I/O) components 110 for connection to (and/or communication with) peripheral devices and modules, and memory 120. The one or more processor cores 100 may operate according to one or more suitable instruction sets such as a Reduced Instruction Set Computing (RISC) instruction set, a Complex Instruction Set Computing (CISC) instruction set, or a combination thereof. In some cases, one or more digital signal processors (DSPs) may be included. Examples of the I/O components 110 include a Universal Serial Bus (USB) interface or High-Definition Multimedia Interface (HDMI). The memory 120 can include DRAM (e.g., wide I/O, HMC, eDRAIVI) as well as the memory controller(s) used to read from and write to memory.

Signals can be communicated between components of the SoC during operation via a functional bus 130. The functional bus 130 can include independent or combined data and control lines (and arbiter(s)). Non-limiting examples of bus architectures for the functional bus 130 include the Advanced Microcontroller Bus Architecture (AMBA) from ARM Ltd., the STBUS from STMicroelectronics, the CoreConnect bus from IBM, and the Wishbone bus from Silicore Corp. Although not shown, a trace bus may be included to facilitate system trace. Traces can be performed to extract signals (e.g., data, internal states) from the core 100 and/or other system components. These extracted signals can be analyzed as part of a debug process. According to various embodiments, no selective capture of filtering is necessary.

To perform in-system debug of the SoC, a debug module 140 is included that reads from and writes to memory 120 via the functional bus 130. The debug module 140 can include buffer(s) 142 and control circuitry 144. The buffer(s) 142 can temporarily store data used and/or generated by the debug module 140. Captured data can be transferred from the buffer(s) 142 at the debug module 140, which may be limited in size, to on-chip memory 120, which may be significantly larger. The transfer of the captured data extends the observation window by orders of magnitude compared to traditional methods.

The control circuitry 144 can include counters, registers, a finite state machine, as well as other logic (e.g., multiplexers) to perform and control aspects of debug. The control circuitry 144 can enable real-time storage of debug information in the memory 120. Information from the debug module 140 can be sent as packetized data (with a time stamp) to the memory 120. Advantageously, through using the debug module 140 and memory 120, a single iteration can be performed for each tested signal set.

The debug module 140 can generate signatures from trace signals and use these signatures to perform debug. A signature refers to compacted information from the trace signal data.

In some cases, triggers may be used to determine when to perform the debug and/or when to write certain data to the memory. For example, signatures may be checked at certain deterministic events (helping to avoid large data overheads and problems with non-determinism of program execution). As another example, trace signals may be checked for certain patterns before checking for an error.

The data flow to and from the on-chip memory 120 is typically managed by a memory controller. In some cases, the debug module 140 can be connected to a memory bus of the functional bus 130 that is used by a processor core or other embedded cores to access the memory controller. The control circuitry 144 of the debug module can include an interface to the memory bus, which depends on bus architecture as described above with respect to the functional bus 130.

Signals can also be read from test access ports 150 such as the JTAG standard test access port and boundary-scan architecture. Therefore, debug and functional testing may be performed in parallel during manufacturing testing.

Figure 2A:
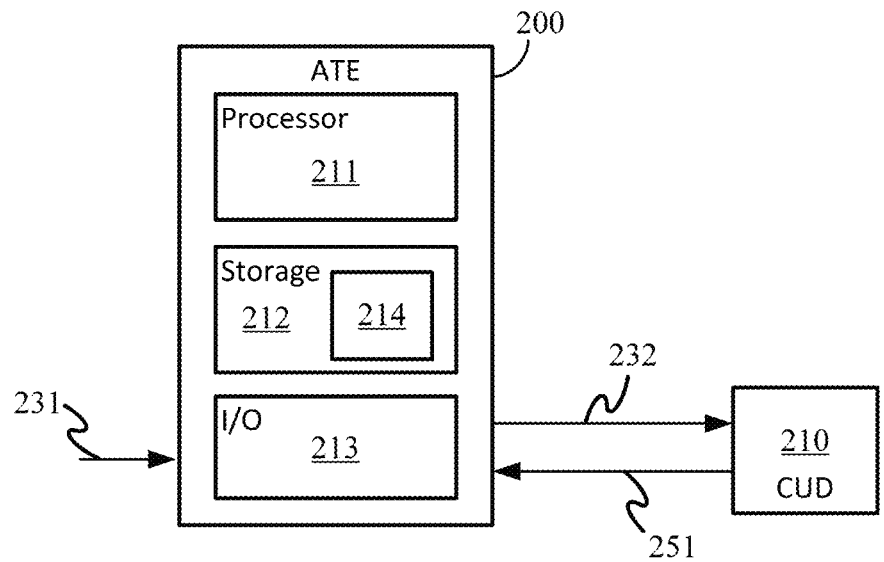
FIG. 2A illustrates an example test environment for debug.
Figure 2B:
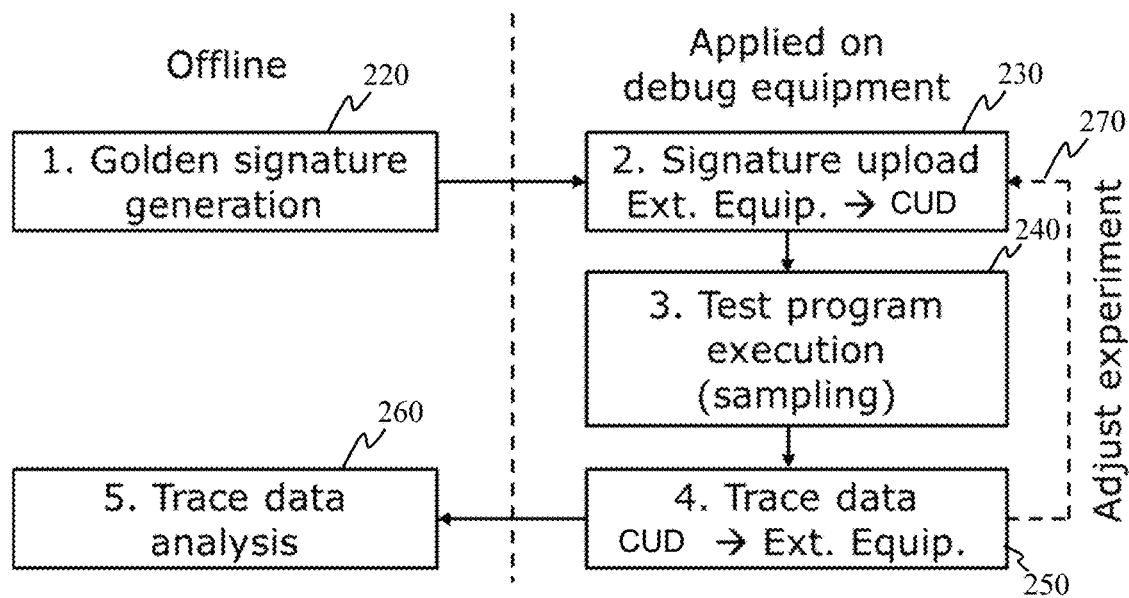
FIG. 2B illustrates an overview of a debug process flow.

FIG. 2A illustrates an example test environment for debug; and FIG. 2B illustrates an overview of a debug process flow. Some aspects of the process flow may be performed offline (e.g., outside of the operating window of the real-time debug test), while other aspects are performed on systems carrying out the real-time debug testing.

Referring to FIG. 2A, an operating environment for carrying out the debug testing can include automated test equipment 200 and the circuit under debug (CUD) 210. The CUD 210 may be any IC with integrated memory such as described with respect to FIG. 1. The ATE 200 can include a processing system 211, storage system 212, and various input/output (I/O) components 213.

Processing system 211 may be implemented within a single processing device or distributed across multiple processing devices or sub-systems that cooperate in executing program instructions. Examples of processing system 211 include general purpose central processing units, application specific processors, and logic devices, as well as any other type of processing device, combinations, or variations thereof. The processing system 211 loads and executes software 214 from storage system 212. The software 214 can include test control programs and other related software for interacting with CUDs including the debug process described herein.

Storage system 212 may include any computer readable storage media that are readable by processing system 211 and capable of storing software 214. Storage system 212 may include volatile and nonvolatile, removable and non-removable media implemented in any method or technology for storage of information, such as computer readable instructions, data structures, program modules, or other data. Examples of storage media include random access memory, read only memory, magnetic disks, optical disks, flash memory, solid state drives, virtual memory and non-virtual memory, or any other suitable storage media. In no case is the computer readable storage media a propagated signal.

Storage system 212 may be implemented as a single storage device, but may also be implemented across multiple storage devices or sub-systems co-located or distributed relative to each other. Storage system 212 may include additional elements, such as a controller, capable of communicating with processing system 211 or possibly other systems.

Some I/O components 213 may include one or more general computing style input and output devices such as a keyboard, display, mouse, speaker, wired and wireless communicate interfaces, and the like. Other I/O components 213 may be for communication with a CUD 210. Such components may include probes, pins, USB, HDMI and the like.

Turning now to FIG. 2B, in Step 1 (220), prior to the actual debug session, "golden" signatures can be generated by simulation of the test program for the CUD using a behavioral model of the circuit. As multiple sets of internal signals can be tapped for tracing, a separate set of golden signatures can be generated for each signal set. In some cases, all signature sets can be generated in one simulation run.

In Step 2 (230), the golden signatures (and test programs(s)) 231 are loaded onto the test equipment (e.g., ATE 200). The ATE 200 can then provide appropriate test signals (and corresponding set of golden signatures) 232 for a selected internal bus to trace to the CUD 210, for example, through an IEEE 1149.1 (JTAG) interface or through shared I/O chip pins. The golden signatures and other information 232 may be stored on-chip in the on-chip memory of the CUD 210 (e.g., memory 120 of FIG. 1).

In Step 3 (240), the test program is executed. The test equipment 200 activates the debug module on the chip of the CUD 210 and triggers execution of the test program to run the test. During execution of the test program, the CUD 210 performs independently of the test equipment. That is, no communication is needed between the CUD 210 and the test equipment 200 while the test is being performed. Instead, the CUD 210 may communicate with the test equipment that the test is finished (with the trace data stored in the CUD's memory). Although no communication is necessary, in some cases, certain pins of the CUD may be observed by the test equipment during the test in order to carry out other testing.

In addition to the golden signatures and the trace data, the test program may also be stored in the on-chip memory of the CUD 210. In some implementations, the on-chip memory can be partitioned such that one partition is dedicated for trace data storage. Bandwidth is available to shift the trace data into the on-chip memory at-speed so that the functional testing can be run in parallel with other applications. Scheduling of memory access operations from the Debug module is carried out so that the access operations do not interfere with the test program. The on-chip memory bandwidth is expected to be suitable for the described techniques. For instance, 10% of the JEDEC Wide I/O 2 maximum bandwidth (51.2 GB/s) is sufficient to trace 32 signals at up to 1 GHz sampling frequency (4 GB/s).

During the execution of the test program, a finite state machine of a debug module (e.g., debug module 140 of FIG. 1) can fetch golden signatures from the CUD's memory, control comparisons between trace data and the golden signatures, control buffers of the debug module, and control sending data to the system bus (e.g., functional bus 130).

In Step 4 (250), the test equipment can read the trace data 251 from the CUD's memory. This trace data can be downloaded to external equipment and stored for analysis. In Step 5 (260), the obtained trace data is analyzed. The analysis can be performed offline, for example, on a work station, freeing the test equipment 200 for another experiment.

Before or while trace data analysis is performed, the experiment can be adjusted (270) and another debug session can be executed with a different setup, for instance, (a) with different trace signals, (b) different test program, or (c) different temperature and voltage settings, as some non-limiting examples.

Accordingly, in some implementations, a software product is provided that can be executed on the ATE to take advantage of the described debug architecture. The software product can include instructions that, when executed on the ATE, direct the ATE to perform the techniques described herein. Instructions for Graphical User Interfaces and/or application programming interfaces can be included so that the ATE can receive golden signatures generated from at least one simulation of a circuit design for the CUD and receive user or programmatic selections of particular signals to trace as well as any other particular testing conditions (e.g., temperature, voltage, test program, and the like). In addition, the software product can include instructions for providing data and activation controls to a CUD and reading data from the CUD. The software product may be downloaded onto a storage system of the ATE via a network connection, be copied from a removable storage device, or used from the removable storage device. The software product enables the ATE to interact with the CUD and take advantage of (as well as support) the CUD's ability to perform the actual signal trace and determination of erroneous data.

Figure 3:
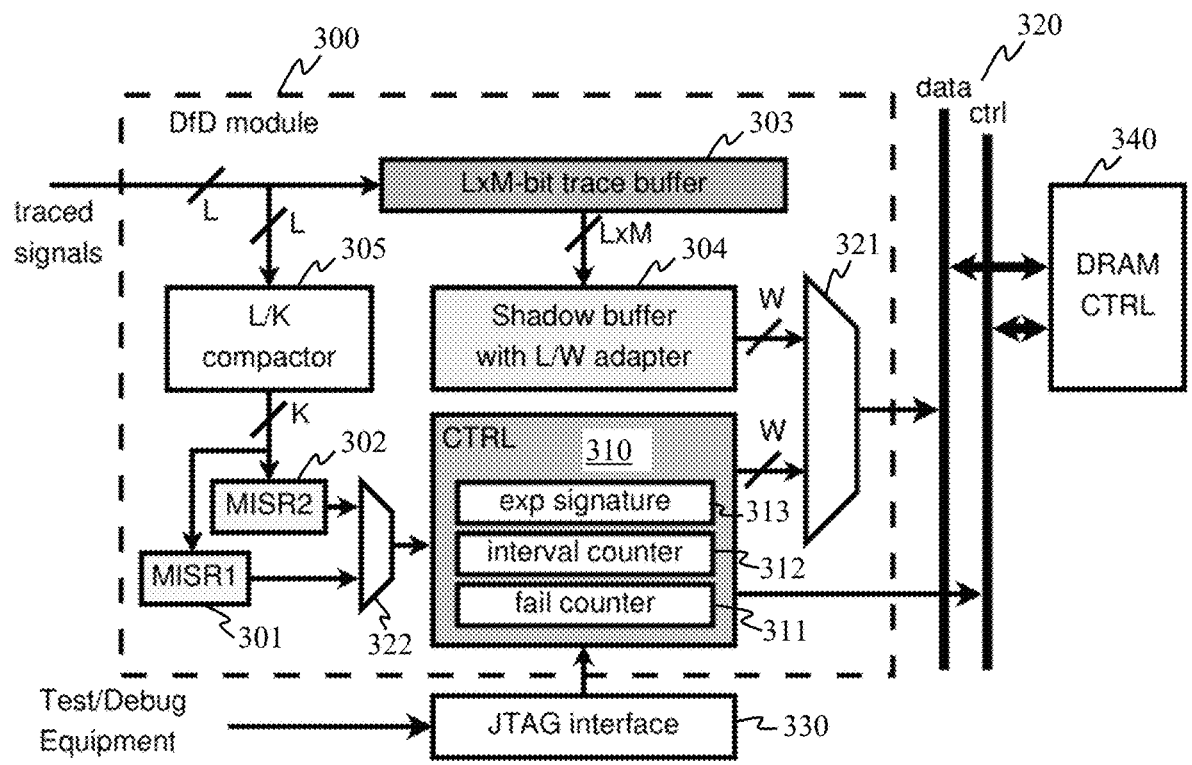
FIG. 3 illustrates an example hardware architecture for implementing the described techniques.

FIG. 3 illustrates an example hardware architecture for implementing the described techniques. FIG. 3 provides one implementation for the debug module 140 of FIG. 1. Table 1 provides a legend for the notation used therein with respect to the data flow between modules of the DfD module 300, which is similar to the notation used in E. Anis Daoud and N. Nicolici, "On Using Lossy Compression for Repeat-able Experiments During Silicon Debug," IEEE Transactions on Computers, vol. 60, no. 7, pp. 937-950, 2011.

TABLE 1

| Symbol | Meaning |
| --- | --- |
| L | Number of observed signals |
| M | Buffer depth and interval length in cycles |
| K | MISR length |
| N | Length of the observation window in cycles |
| S | Timestamp length |
| W | Memory-interface width |

Referring to FIG. 3, a DfD architecture can include, for an IC with on-chip memory, two multiple-input signature registers (MISRs) 301, 302 to alternatingly generate a signature for a current interval and hold the signature from the previous interval; a trace buffer 303 to initially store trace data; a shadow buffer 304 to which trace data initially stored in the trace buffer 303 is copied and from which the trace data is transferred to on-chip memory (not shown); and a control (CTRL) logic block 310 that employs a finite-state machine (FSM) to generate control signals for other blocks in the DfD module 300. The CTRL block 310 may include an interval counter 311, a fail counter 312, and an expected signature register 313 (and comparator). In addition to being connected to data and control lines of a functional bus 320, the DfD module 300 can be accessible via JTAG pins 330.

The MISRs 301, 302 are used to generate independent signatures for each time interval in order to identify failing intervals and store them. The recording of error-free intervals can be skipped and the observation window for the same amount of available memory can be increased. The debug operation begins by capturing L signals at the functional clock frequency. The sampled values of the L signals are shifted into an L×M trace buffer 303, where L is the width and M is the depth of the buffer. This buffer 303 serves as a temporary storage of trace data captured in one time interval of the length M. At the same time, the "observed" L signals can be fed into an L-bit MISR (either MISR1 301 or MISR2 302) to identify failing intervals and skip the storage of error-free intervals. The L signals can first optionally pass through an L-to-K compactor 305 to match the input width of the MISR to the width of the observed bus. In some cases, the compactor 305 is implemented as an XOR tree. The MISR calculates a K-bit long signature for each interval of M cycles that is used to identify failing intervals by comparing the K-bit long signatures with expected signatures that are stored in the on-chip memory. Once a signature miscompare is detected, the captured data from the current interval is uploaded from the trace buffer 303 to the shadow buffer 304, from where it is shifted into the on-chip memory (e.g., DRAM), together with the number of the current interval as time stamp via, for example MUX 321. The control logic starts and ends the debug session and provides control signals to other DfD blocks and on-chip memory.

In operation, the current interval's signature stored in one of the two MISRs 301, 302 is compared with an expected signature, for example a "golden signature" (loaded from memory at register 313). The previous interval's signature that was stored in the other MISR is reset and the current interval's signature becomes the previous interval's signature at the start of the next interval. The alternating selection of the two MISRs may be carried out by a MUX 322.

The expected, or "golden", signatures for the MISRs can be pre-calculated by simulating the behavioral model of the circuit. Intervals containing non-deterministic data (e.g., "unknown" or "X") that are identified during the simulation can have a random expected signature applied. For example, the random expected signature may be all "0s".

During testing, in one case, when a captured interval of trace data contains non-deterministic bits, the captured interval may be used for statistical analysis or ignored. In another case, a masking bit may be provided to the control circuitry for each captured interval of trace data containing non-deterministic bits in order to skip those intervals. Masking introduces some hardware overhead, but reduces the amount of data to store. In yet another case, both techniques may be combined so that some intervals containing non-deterministic bits can be observed while others are skipped or ignored as being of no importance.

During the testing, the sampled trace data is shifted into a trace buffer 303. Then, before a new interval begins (e.g., every M cycles), the content of the trace buffer 303 is copied into the shadow buffer 304, which has the same capacity as the trace buffer 303 (e.g., L×M). The purpose of the shadow buffer 304 is to hold an interval of trace data until it is transferred to the on-chip memory (e.g., via memory controller 340) while the next interval is sampled into the trace buffer 303, such that no trace data is lost. In addition, the shadow buffer serves as an adapter to the memory interface, which can operate at a frequency different from the sampling frequency and have an output data bit-width different than that of the trace buffer. For example, if the memory interface has an input data bit-width W, L can be selected such that W is a multiple of L (i.e., W=kL) and the shadow register (shadow buffer) may be partitioned into k segments that simultaneously shift their content into the on-chip memory. Thus, if the write data channel W is 128 bits wide and the number of observed signals L is 32, the shadow register (shadow buffer) is split into four segments, each of which feeds into the 128-bit-wide data channel. This allows for sampling frequencies much higher than the memory bus operating frequency (e.g., up to 4× for the instant example).

Figure 4:
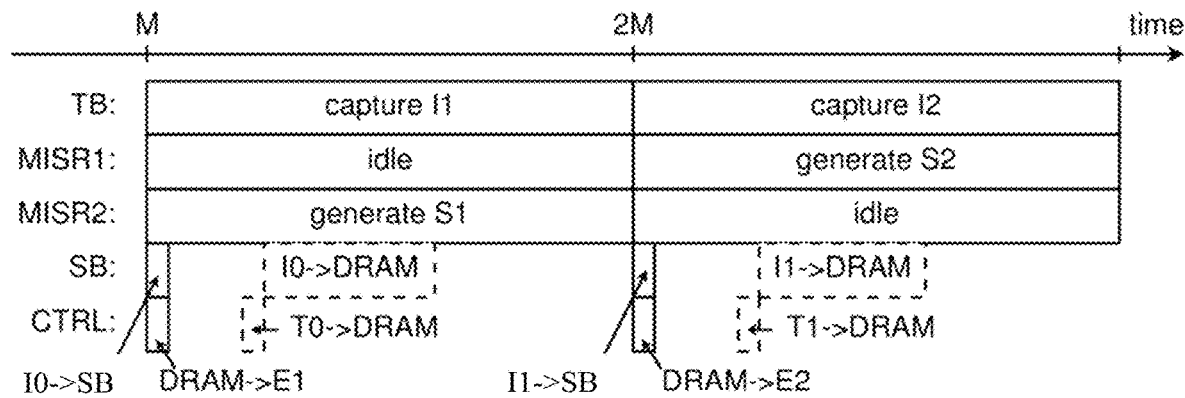
FIG. 4 illustrates a timing diagram for operations of debug modules during signal tracing.

The CTRL 310 provides control signals to the other DfD blocks and schedules their operations. FIG. 4 illustrates a timing diagram for operations of the blocks of a debug module 300 during signal tracing. As shown, TB refers to trace buffer 303, MISR1 refers to MISR 301, MISR2 refers to MISR 302, SB refers to shadow buffer 304, and CTRL refers to CTRL 310.

The observation window is divided into intervals of size M each. For each interval, the active MISR (either 301 or 302) calculates a corresponding signature. Every M cycles, CTRL 310 sends a signal to the trace buffer 303 to upload the current interval (labeled as I0, I1, . . . Ii) into the shadow buffer 304. Before the capturing of the current interval is complete, the expected signature (labeled as E1, E2, . . . Ei) is loaded from the on-chip memory (signal path not shown) into an extra register in CTRL 310 (e.g., the expected signature register 313). At the time when the capturing of current interval is complete (e.g., at cycle nM, n=1, 2, . . . ), the MISRs (301, 302) switch roles, and the generated signature is compared with a golden signature (E1, E2, . . . Ei). After that, the inactive MISR (301, 302) is reset, while the other MISR (302, 301) is generating a signature for the next interval.

If a miscompare of signatures occurs, CTRL 310 first writes the current time stamp (e.g., T0, T1, . . . Ti) into the on-chip memory for interval identification. The current time stamp may simply be the value of an interval counter that is incremented every M cycles.

Next, CTRL 310 initiates shifting of the erroneous interval from the shadow register (shadow buffer) into the on-chip memory. After the shifting is completed, a next memory read operation, such as the loading of an expected signature, may be permitted. CTRL 310 also generates the address signals for the on-chip memory in order to access the expected signatures for each interval, and store failed intervals. To generate the address signals, the CTRL 310 can include two counters that are multiplexed into the address lines of the on-chip memory. These counters can be initialized depending on where the memory block containing the expected signatures and the block containing trace data should be placed in the memory space.

Figure 5:
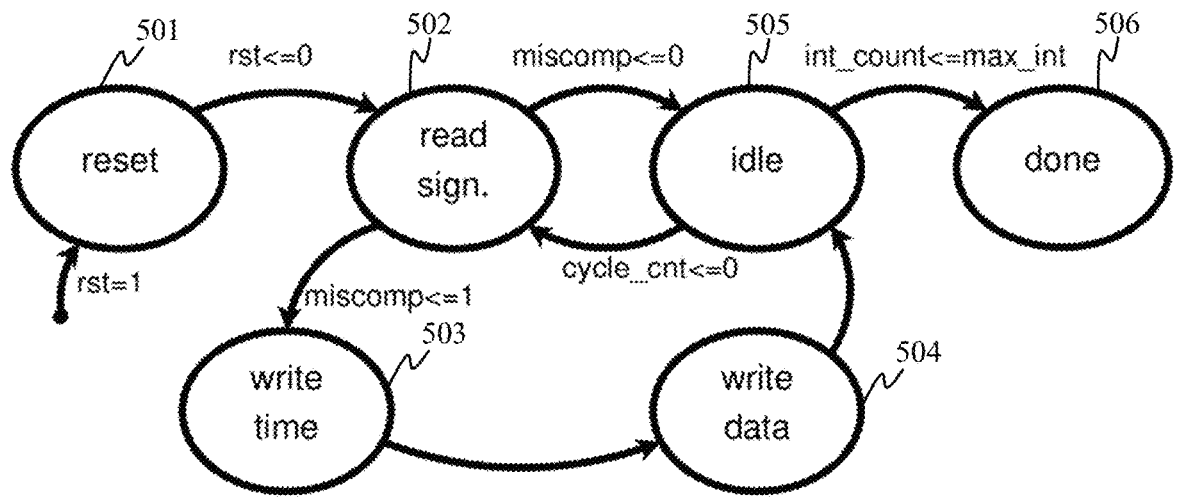
FIG. 5 is a simplified state diagram for a finite state machine of the control block CTRL.

The CTRL 310 can employ an FSM to schedule the operations of the DfD blocks. FIG. 5 is a simplified state diagram for a finite state machine of the control block CTRL. Referring to FIG. 5, from an initialization/reset state (rst=1), the reset signal rst can be deasserted (rest<=0) 501, and the FSM can move into a "read signature" state 502 in order to fetch the expected signature for the next interval. At the "read signature" state 502, the shadow register (shadow buffer 304) can be updated and the generated signatures can be compared to the expected signatures. In the case of a miscompare (miscomp<=1), the FSM moves to a "write time" state 503 and then to a "write data" state 504 in order to store the time stamp and the trace data, respectively, for the miscompare. In some implementations, the time stamp and trace data can be written during a single step subsequent to a packetizing step where the time stamp and trace data are packaged together.

The FSM can then wait in an "idle" state 505 until a new interval starts, which is determined by a cycle counter cycle_cnt. This procedure repeats until the interval counter has reached a specified value or until the reset signal rst is asserted (rst=1). At the end of the debug session (a done state 506), the counter pointing to the current address of the trace data in the on-chip memory can be read by the external equipment in order to know what part of the on-chip memory contains the trace data, which also implies the number of failed intervals.

Figure 6:
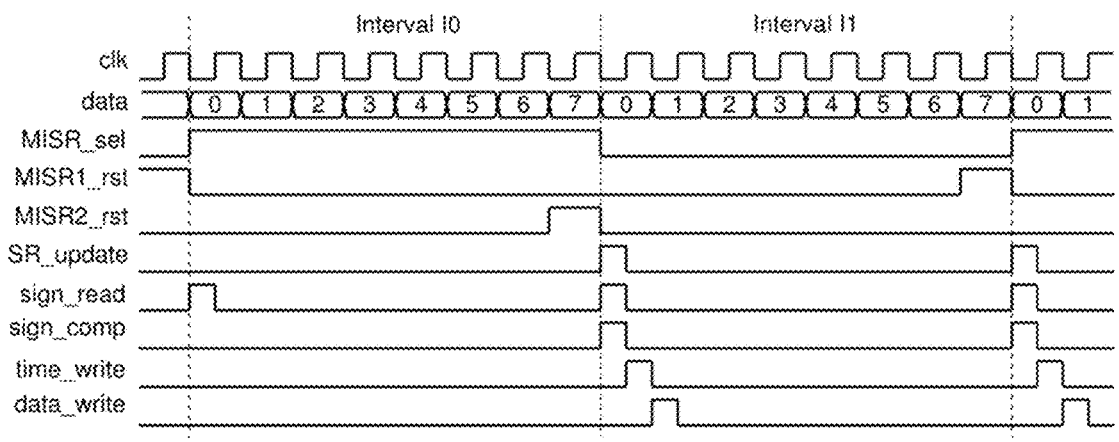
FIG. 6 shows an example of a timing diagram for control signals generated by CTRL for the DfD blocks of the example hardware architecture of FIG. 3.

FIG. 6 shows an example of a timing diagram for control signals generated by CTRL for the DfD blocks of the example hardware architecture of FIG. 3. Trace data is sampled by the MISRs 301, 302 and the trace buffer 303 on positive edges of a clock signal clk. In this example, the MISR_sel control signal alternates every interval and selects between the MISRs such that MISR1 301 is active during even intervals, and MISR2 302 is active during odd intervals. MISR1_rst and MISR2_rst reset the corresponding MISRs 301, 302 at the end of their inactive interval. After the last value of an interval is sampled, SR_update is asserted on the negative edge of clk in order to update the content of the shadow register (shadow buffer 304) from the trace buffer (303). At the beginning of each interval, sign_read is asserted for reading the expected signature for the current interval from the on-chip memory. The signal sign_comp initiates the comparison of the generated signature with the expected one (and is asserted). If a signature miscompare is detected, time_write and data_write are asserted after each other to initiate the writing in the on-chip memory of the timestamp and the content of the shadow register, respectively.

In some implementations, there may be long memory-access latencies, especially if multiple modules connected to the bus request memory access at the same time. For instance, if the read-access latency exceeds one interval (M clock cycles), the expected signature may not be available for the comparison. Write-access latency is less critical, as memory controllers typically employ buffers for data to be written in the memory. However, certain test programs may cause high data-traffic peaks, in which case the DfD module will not be able to store a faulty interval within M cycles. To address the latency problem, a sufficiently large M can be selected based on the memory-interface specification. The experimental examples use a minimum depth of the trace buffer $M_{min}$=64. This value was selected because the current average access latency of 3D-stacked DRAM using TSVs is 25 ns. Thus, even including the overhead due to the data bus and the memory controller, the latencies for loading expected signatures and storing trace data is considerably lower than 64 clock cycles at 1 GHz frequency.

The minimum depth of the trace buffer $M_{min}$ can be adjusted depending on the specification of the memory controller and the memory workload of the test program. Test programs causing excessive memory access operations may increase the maximum memory latency for the DfD module; therefore M can be increased accordingly.

Figure 7:
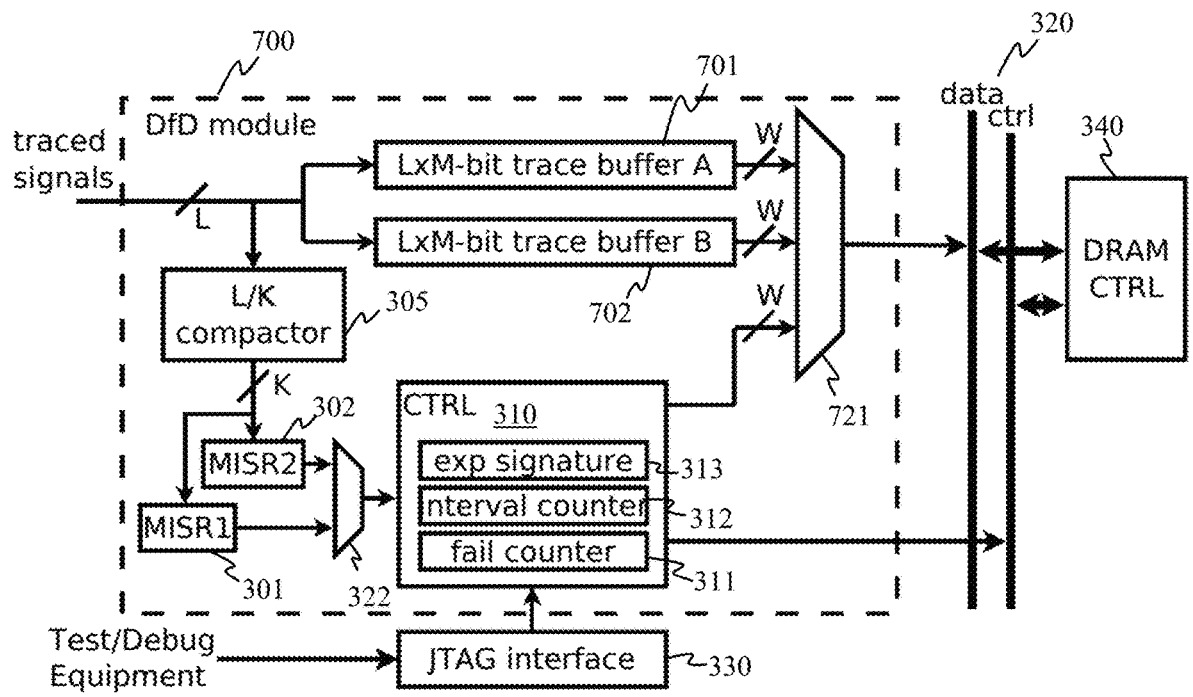
FIG. 7 illustrates another example hardware architecture for implementing the described techniques.

FIG. 7 illustrates another example hardware architecture for implementing the described techniques. Similar to the architecture described with respect to FIG. 3, a DfD architecture can include, for an IC with on-chip memory, two multiple-input signature registers (MISRs) 301, 302 to alternatingly generate a signature for a current interval and hold the signature from the previous interval; and a control (CTRL) logic block 310 that employs a finite-state machine (FSM) to generate control signals for other blocks in the DfD module 700. The CTRL block 310 may include an interval counter 311, a fail counter 312, and an expected signature register 313 (and comparator). In the implementation shown in FIG. 7, the trace buffer 303 and shadow buffer 304 are replaced with two trace buffers: trace buffer A 701 and trace buffer B 702, which alternatingly store the trace signals so that one buffer stores trace signals of a current interval while the other buffer is storing the trace signals of the interval being written to memory.

The debug operation begins by capturing L signals at the functional clock frequency. The sampled values of the L signals are shifted into one of the two L×M trace buffers 701, 702, where L is the width and M is the depth of the buffer. This buffer (e.g., 701) serves as a temporary storage of trace data captured in one time interval of the length M. At the same time, the "observed" L signals can be fed into an L-bit MISR (either MISR1 301 or MISR2 302) to identify failing intervals and skip the storage of error-free intervals. The L signals can first optionally pass through an L-to-K compactor 305 to match the input width of the MISR to the width of the observed bus.

The MISR calculates a K-bit long signature for each interval of M cycles that is used to identify failing intervals by comparing the K-bit long signatures with expected signatures that are stored in the on-chip memory. Once a signature miscompare is detected, the captured data from the current interval can be shifted from the trace buffer A 701 to the on-chip memory together with a time stamp (e.g., via MUX 721, which is also connected to trace buffer B 702 and CTRL block 310). While the trace data from trace buffer A

701 is shifted to the on-chip memory, a next interval of trace data can be stored in trace buffer B 702.

The following description provides an analysis and evaluation of an implementation of the described techniques.

Analysis of Compression Effectiveness

By storing only erroneous intervals, the result achieves a compression of trace data. It is possible to estimate the compression ratio based on the frequency of errors in the stream of trace data, using the total amount of observed trace data as a baseline. The stored data includes the actual trace data, the expected signatures, and the time stamps.

The length of the observation window is denoted as N (in clock cycles). The total amount of bits observed is therefore LN, which is used as a baseline. The total number of intervals can be expressed as N/M. Each interval signature contains K bits, hence the amount of bits used to store all signatures is $$\frac{NK}{M}.$$

Assuming that errors in the data stream are independent and erroneous words on the observed bus occur with the probability p, the probability that an interval of length M bits contains at least one erroneous word can be calculated as $$P = 1 - (1-p)^M$$

A random variable X can be defined as the number of erroneous intervals in the observed data stream. The expectation of X can be expressed as $$E[X] = P\frac{N}{M},$$

which is used to calculate the expected number of bits to be stored as $$E[X](S + LM) = \frac{PN}{M}(S + LM)$$

where S is the size of the time stamp that is added to each interval for identification. The compression ratio can be calculated using the total number of bits in the stream as a baseline:

$$r = \frac{\text{number of bits in stream}}{\text{stored data}} = \frac{LN}{\frac{PN}{M}(S + LM) + \frac{KN}{M}} \quad (1)$$

$$= \frac{LM}{(1 - (1-p)^M)(S + LM) + K} \quad (2)$$

Figure 8:
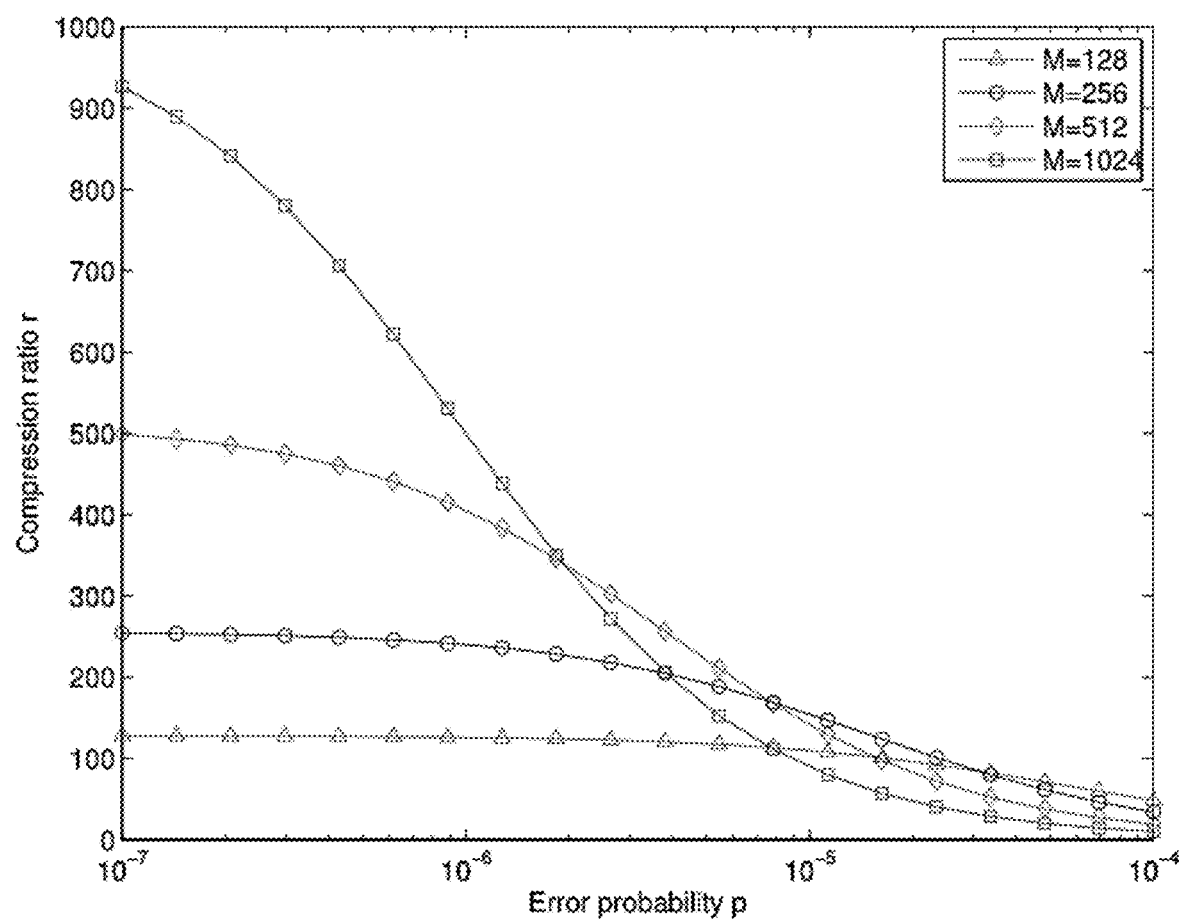
FIG. 8 shows a plot of the compression ratio r as a function of error probability p for different interval lengths of M cycles, where $L=K=32$, and $S=32$.

FIG. 8 shows a plot of the compression ratio r as a function of error probability p for different interval lengths of M cycles, where L=K=32, S=32. FIG. 8 assumes a uniform distribution. For practical reasons, the implementation-related input parameters are powers of two. For low error probabilities, only a few intervals are erroneous and need to be stored, hence the stored data is dominated by the expected signatures, allowing for high compression. In the case of a high error probability, nearly all intervals are erroneous and need to be stored, in addition to the expected signatures, hence no compression is achieved. This observation is consistent with FIG. 8, as M=128 provides the highest compression for small values of p, and M=1024 provides the highest compression for large values of p.

Similarly, it is possible to obtain the compression ratio for the model using burst errors of a fixed size B. The depth of the trace buffers is assumed to be larger than B. Thus, an error burst either occurs within one interval of size M or overlaps two intervals. In worst case, each burst overlaps two intervals and any two neighboring burst are sufficiently far apart such that no two bursts occur within the same interval. Therefore, the maximum number of erroneous intervals is twice the number of bursts, the expectation of which is $\boxed{\phantom{x}}$. As the trace data for each interval including the time stamp of size S is stored, the amount of data that needs to be downloaded from memory is $2\lceil pN/B \rceil \times (LM+S)$. In addition, expected MISR signatures of total size KN/M are uploaded prior to the debug session. Therefore, the resulting worst-case compression ratio can be calculated as $$r = \frac{\text{number of bits in stream}}{\text{stored data}} \quad (3)$$

$$= \frac{LN}{2\left\lceil\frac{pN}{B}\right\rceil(LM + S) + \frac{KN}{M}} \quad (4)$$

Figure 9:
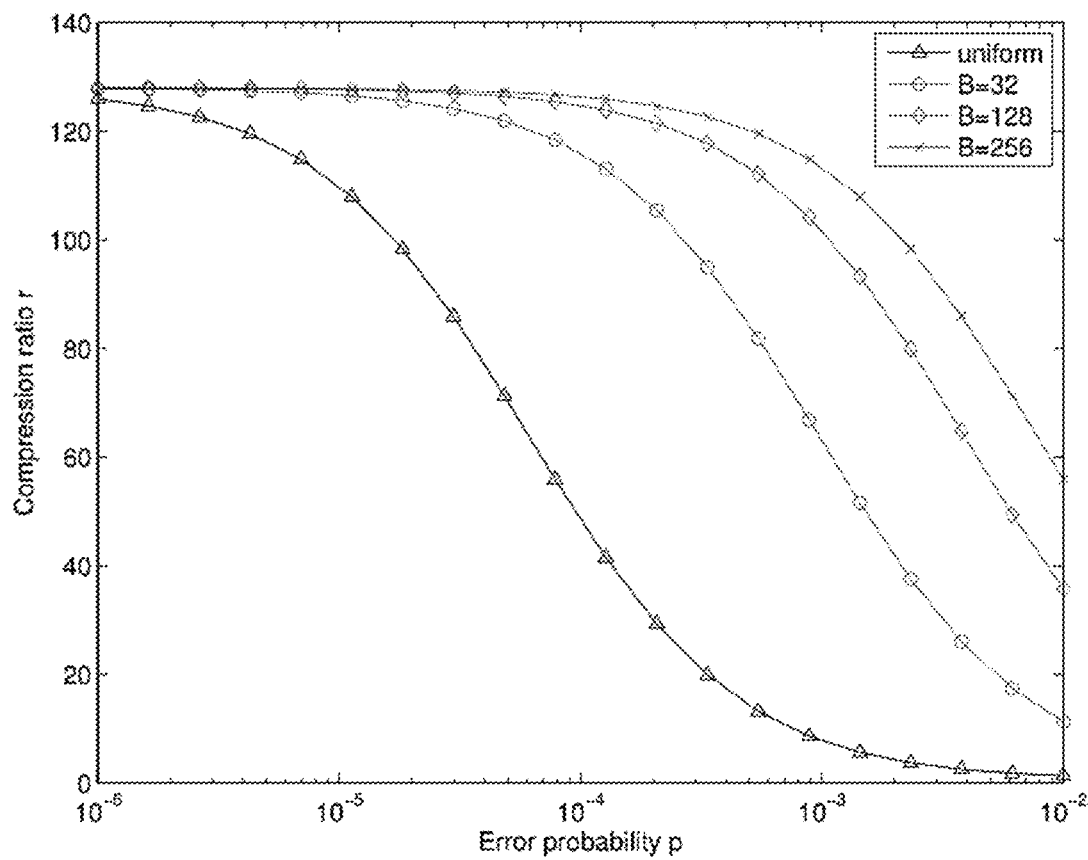
FIG. 9 shows a plot of the compression ratio r as function of error probability p for error bursts of different lengths, where $L=K=32$, $S=32$, and $M=128$.

FIG. 9 shows a plot of the compression ratio r as function of error probability p for error bursts of different lengths, where L=K=32, S=32, and M=128. FIG. 9 shows the compression ratio in the case of error bursts, where "uniform" corresponds to uniformly distributed errors. As erroneous words are clustered in this case, it is possible to achieve high compression even for relatively large values of p.

Given a given p, large buffers are more likely to capture at least one erroneous bit and hence more trace data need to be stored compared to smaller buffers. However, small buffers result in more intervals and hence more expected signatures that need to be uploaded to memory. Therefore, it is possible to optimize the depth of the trace buffers M for better compression depending on the assumed error probability p.

For sufficiently low error probabilities, $p \ll 1, (1-p)^M \approx (1 - pM)$, and Equation (2) can be simplified to $$\approx \frac{M}{pM(S + LM) + K}.$$

By setting the derivative $\partial r/\partial M$ to zero, it can be seen that $M = \sqrt{K/pL}$ provides maximum compression for the case when other parameters are given. For practical reasons, M can be selected to satisfy the following constraints:
1) M is a power of two, which simplifies the implementation.
2) M is given an upper limit based on silicon-area overhead. At the present time, a reasonable number for this limit in case of L=32 is $M_{max}$=512, such that the combined memory size of the trace buffer and shadow buffer is 4 KB.
3) M is given a lower limit ($M_{min}$). By inhibiting the interval length from being shorter than the memory latency, the DfD module should be able to fetch expected responses and store trace data on time.

Figure 10:
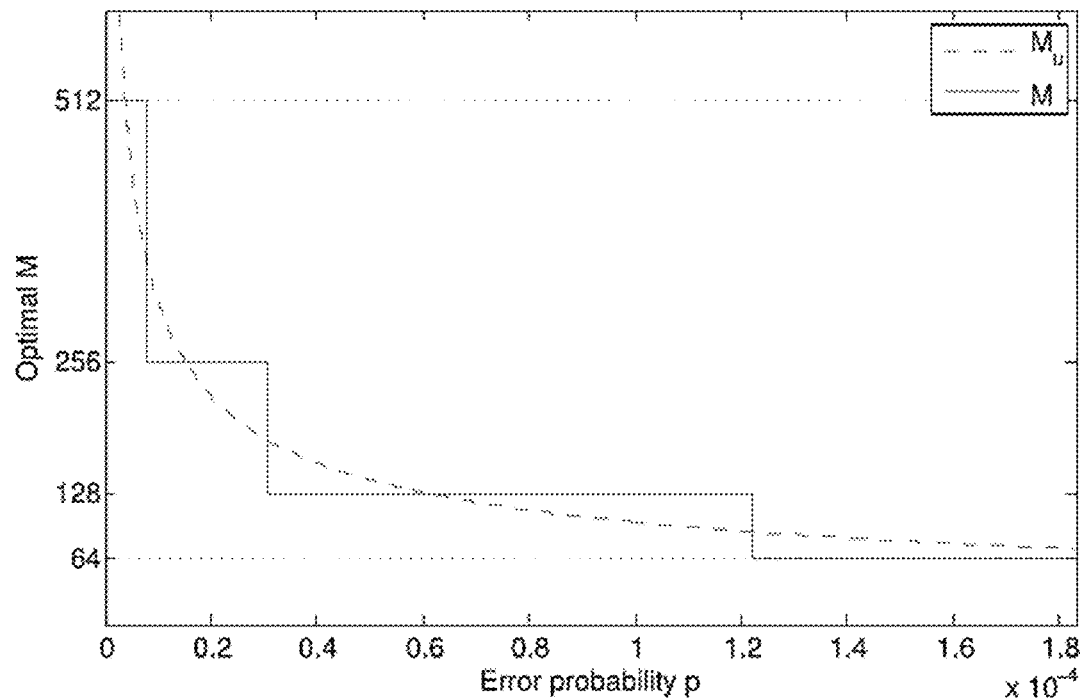
FIG. 10 shows a plot of optimal trace depth M as a function of error probability p for the case $L=K=32$.

Due to these constraints, optimal values of M can be represented as a descending staircase function of p as shown in FIG. 10, where $M_u$ is the unconstrained diagram for optimal M. The jump points that can be calculated by equating r(M)=r(2M). Solving this equation for p provides the jump points $$p = \frac{K}{2LM^{2i}}$$

where M={64, 128, 256}. The observation that optimal values of M are decreasing with the increasing values of p, is consistent with FIG. 8 Using this diagram, the depth of the trace buffers can be selected in order to maximize data compression, reducing the memory requirements and the communication time with the ATE.

Experimental Results

Example DfD Implementation and Simulation

A Verilog RTL model of the architecture illustrated in FIG. 3 was created and synthesized using a 45 nm CMOS library. For the case L=K=32, S=32, and M=128, the synthesized circuit contained 8293 sequential and 8725 combinational gates. The standard-cell area of the design was 0.061 mm², which is negligible for realistic chips. For instance, on a 25 mm² die, the DfD circuitry would only occupy 0.24% of the die area.

In the first experiment, the functionality of the design was verified through simulation by using randomly generated data as an input stream. First, the expected signatures were calculated by applying the input stream to the MISR and recording the MISR's value every M cycles. In the second run, the full circuitry was simulated, where the DRAM was modeled as a Verilog module and initialized with the pre-calculated signatures. As expected, all intervals passed the comparison and no trace data was stored into the DRAM. In the third run, errors were injected by altering some of the bits in the input stream. As expected, the circuitry was able to identify erroneous intervals and store them into the DRAM.

Next experiments involved a Verilog model of a JPEG encoder. This instantiation involved an instance of the encoder and an instance of the DfD module with the parameters L=K=32, S=32, and M=64. A decoder was connected to an internal data bus in the encoder. The first simulation involved the encoding of a picture in JPEG format (11,432 clock cycles) using the fault-free model. In this simulation 177 golden MISR signatures were recorded, starting from clock cycle 125 in order to avoid uninitialized states of the bus. Then, bugs were injected in the RTL code of a FIFO unit within the encoder module and the simulation was re-run with the enabled DfD module. Depending on the location of the bug, it was possible to observe a different behavior of the circuit. In some cases, a bug caused errors in all 177 intervals, resulting in storage of the all traced data. In practice, however, this kind of bug is relatively simple to localize, as the errors already start to occur within the first few hundred clock cycles. In other cases, a bug manifested itself after 5,127 error-free clock cycles, i.e., after 78 error-free intervals, corrupting all following intervals. As expected, error-free intervals were excluded from storage in the DRAM. Therefore, only 56% of the intervals had to be stored for analysis. This type of a bug is difficult to localize using conventional tracing methods, as many iterations are required to identify the time window when errors start to occur. The proposed method allows for rapid error localization using only one iteration.

In another experiment, a Verilog model of a hyper-pipelined microprocessor OpenRISC 1200 HP was simulated. As in the previous experiment of the JPEG encoder, an instance of the DfD module with the parameters L=K=32, S=32, and M=64 was connected to an address bus within the CPU. A random instruction sequence was executed over 20,000 clock cycles, and 313 golden signatures were recorded. Next, bugs were injected in the control flow of the program-counter generation unit. Similar to the previous experiment, some bugs corrupted all intervals. However, a certain bug resulted in only six erroneous intervals that were scattered over the entire observation window of 313 intervals. Therefore, only 2% of the intervals had to be stored in the DRAM for analysis. Another bug in the datapath of the ALU caused several short error bursts, resulting in only four erroneous intervals (1.3%) that occurred at the end of the observation window. In practice, this kind of bug requires an extensive effort for localization, as the observed data is erroneous for only a few clock cycles during the entire observation window. Using the proposed method, it is possible to identify and store the erroneous intervals in only one iteration.

Comparison of Example Implementation with Selective Capture Method

The example implementation framework has been compared with the method based on selective capture proposed in J.-S. Yang and N. Touba, "Improved Trace Buffer Observation via Selective Data Capture Using 2-D Compaction for Post-Silicon Debug," IEEE Transactions on VLSI Systems, vol. 21, no. 2, pp. 320-328, February 2013 (the "Selective Capture Method"). The Selective Capture Method uses a three-pass debug methodology in order to expand the observation window. In the first pass, the error rate is calculated using parity bits. In the second pass, suspect clock cycles are determined. In the third pass, the erroneous data is captured during suspect clock cycles.

Figures 11, 12:
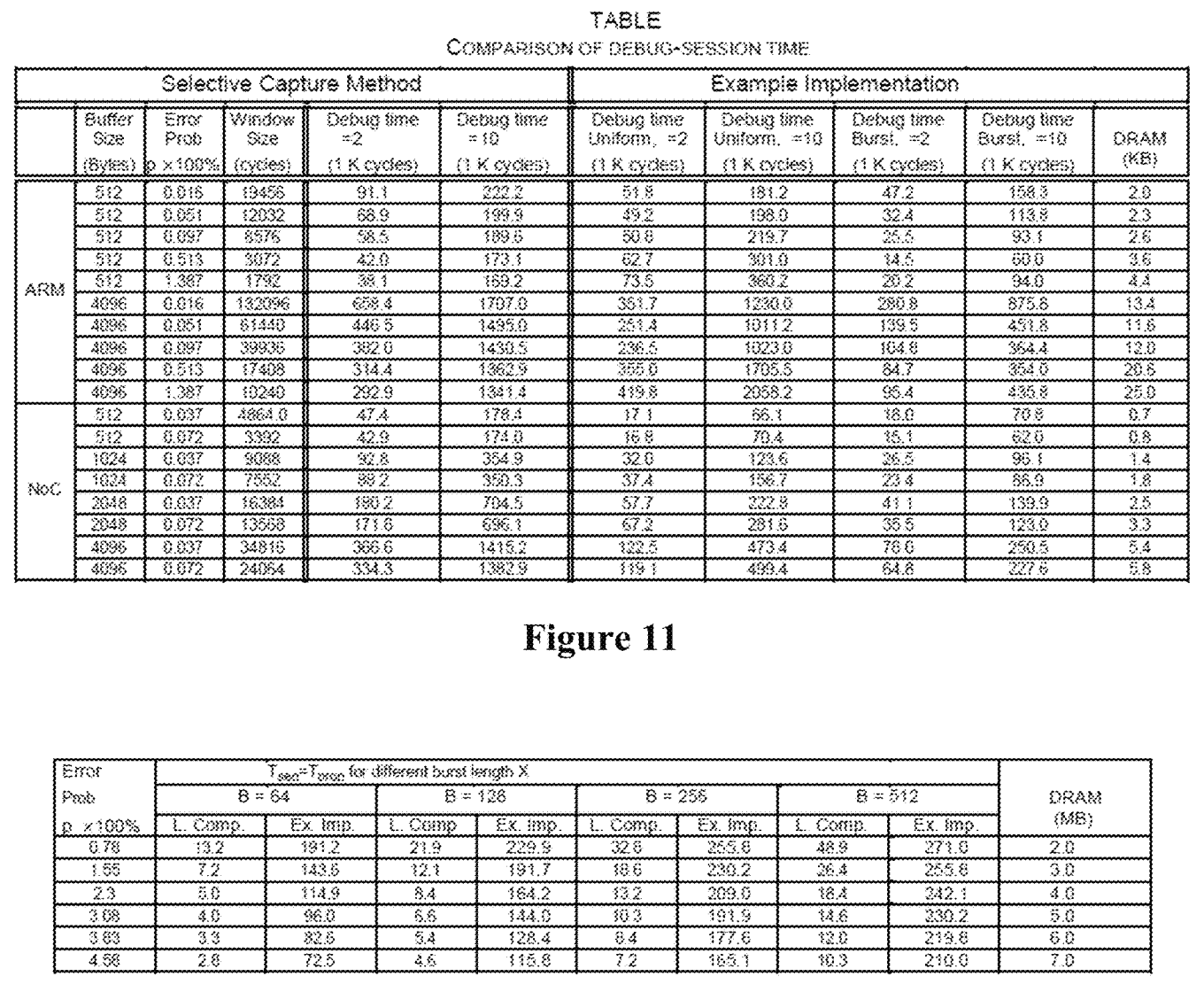

FIG. 11 shows a table providing a comparison of debug session time between the example implementation and the Selective Capture Method. The first four columns of the Table shown in FIG. 11 repeat the data published in the paper describing the Selective Capture Method: the design used, the trace buffer size, the error probability (referred to as "error rate" in the paper), and the length of the expanded observation window. These are used to (a) compare the debug-session time, and (b) estimate the required DRAM capacity in order to achieve the same observation window using the example implementation.

The estimated debug-session time is the sum of the on-chip sampling time and the communication time, where the computation time between iterations is neglected. The Selective Capture Method requires three iterations; hence the on-chip sampling time can be estimated as as $3N \times f_{CUD}$, where N is the length of the expanded window in cycles and $f_{CUD}$ is the operating frequency of the circuit under test (sampling frequency). After the first iteration, parity data is downloaded from the trace buffer to the external equipment. After the second iteration, generated signatures are downloaded and the tag data uploaded into the trace buffer. Finally, the actual trace data is downloaded. In total, the trace buffer is accessed four times; therefore, the communication time can be estimated as $4T = f_{CUD}$, where T is the size of the trace buffer and is the ratio of $f_{CUD}$ to the frequency of the external equipment, which is usually slower than $f_{CUD}$. The total debug time expressed in functional clock cycles is therefore $$3N+4\alpha T.$$

The total debug time for $\alpha=2$ and $\alpha=10$ are shown in FIG. 11. For comparison, the estimated debug time using the example implementation and the same input parameters is also provided in FIG. 11. Two cases were considered: uniform error distribution and burst errors. The example implementation requires only one iteration; hence the sampling time is $N\times f_{CUD}$. The communication time in case of a uniform defect distribution can be estimated using the compression ratio r calculated in Equation (2) as $NL/r\times \alpha/f_{CUD}$, where NL is the uncompressed observed data in bits. Therefore, the total debug time expressed in functional clock cycles is $$N(1+\alpha L/r).$$

The depth of the trace buffers in the example implementation was set to M=64, which was optimal for most given error probabilities. It should be noted that the trace buffer is only used as a temporary storage before transferring the data to the DRAM; hence the trace buffers can be small even for large observation windows. For burst errors, the communication time was estimated based on the amount of data that needs to be downloaded from DRAM as well as the amount of data that needs to be uploaded prior to the debug session. Here, it is expected that the amount of data to be downloaded from DRAM is $2\lceil pN/B\rceil \times (LM+S)$, where B is the burst length. In addition, expected MISR signatures of total size KNIM are expected to be uploaded prior to the debug session. The resulting debug time expressed in functional clock cycles totals $$N + \alpha\left(2\left\lceil \frac{pN}{B} \right\rceil (LM + S) + \frac{KN}{M}\right).$$

The Table in FIG. 11 shows the estimates using M=B=64 for $\alpha=2$ and $\alpha=10$. In addition, the last column of the Table in FIG. 11 shows an estimated the amount of DRAM that should be available in order to achieve the same length of the observation as in the Selective Capture Method.

The results presented in FIG. 11 show that the debug time of the example implementation is shorter than that of the Selective Capture Method for low error probabilities in case of uniform distribution. In case of burst errors, the debug time of the example implementation is even shorter since erroneous data words are condensed, resulting in less erroneous intervals that need to be stored. As reflected by the results of the comparison, for a similar sized observation window as other methods, the proposed method (as illustrated using the example implementation) requires only a few KB of available DRAM. In realistic circuits, such as in IC with eDRAM or 3D-ICs with wide-I/O DRAM, the amount of available on-chip-like memory will be larger by several orders of magnitude, resulting in an observation window that is also larger by several orders of magnitude, which in turn results in much more efficient debug sessions.

In addition to debug time, the example implementation shows robustness. Both the example implementation and the Selective Capture Method require deterministic execution of the test program in order to calculate "golden" signatures. However, even if the trace data observed in a fault-free circuit is deterministic, the values observed in a faulty circuit can be non-deterministic. For instance, an electrical bug can cause metastability issues on timing-critical paths, such that the affected flip-flops capture erroneous values only with a probability less than one. In cases of such electrical bugs, the tag data generated during one iteration of the Selective Capture Method may not correspond to the actual erroneous cycles in the next iteration. Hence the data obtained by using the Selective Capture Method may not represent the "full picture". In the example implementation, all erroneous cycles can be captured unless an aliasing occurs, which is unlikely for sufficiently large K. Even if erroneous cycles are different for each test-program run using the example implementation, it is possible to obtain a "full picture" containing all erroneous data for each run independently of previous runs.

Comparison of Example Implementation with Lossy Compression Method

In the paper from E. Anis Daoud and N. Nicolici, "On Using Lossy Compression for Repeat-able Experiments During Silicon Debug," IEEE Transactions on Computers, vol. 60, no. 7, pp. 937-950, 2011 (the "Lossy Compression Method"), the authors propose an iterative debug scheme. The Lossy Compression Method involves multiple iterative debug sessions with intermediate post-processing steps. In the first iteration, time intervals in which erroneous data is captured are identified using lossy compression. In the following iterations, the method zooms into these intervals for a better resolution. In the paper describing the Lossy Compression Method, the authors calculate the ratio of the debug time $T_{prop}$ compared to the debug time using sequential debug sessions $T_{seq}$. In the Table shown in FIG. 12, a comparison of debug session time between the example implementation ("Ex. Imp.") and the Lossy Compression Method ("L. Comp.") is provided. The ratio $T_{seq}/T_{prop}$ for the example implementation can be calculated as follows:

$$\frac{T_{seq}}{T_{prop}} = \frac{\left(1 + \frac{N}{M}\right) \times \frac{N}{2} + \alpha NL}{N + \alpha\left(2\left\lceil \frac{pN}{B} \right\rceil (LM + S) + \frac{KN}{M}\right)}.$$

The results show that the debug time using the example implementation is 5-20 times faster compared to that of the Lossy Compression Method by using less than 7 MB of DRAM. Note that this memory is part of functional DRAM, hence it does not introduce any extra overhead on the chip.

As illustrated by the example implementation and comparisons with the Selective Capture Method and Lossy Compression Method, it is possible to perform massive signal tracing in ICs that integrate fast DRAM, such as 2D-ICs with embedded DRAM or 3D-stacked ICs with wide-I/O DRAM dies. By using a relatively large on-chip DRAM for trace-data storage, it is possible to increase the observation window by orders of magnitude compared to traditional methods that use trace buffers. In certain implementations of the described techniques, erroneous intervals are selectively captured into the on-chip memory by comparing signatures of the trace data and comparing the signatures with the expected signatures that are pre-calculated offline and uploaded to the on-chip memory before a debug session. The described methods allow for capturing erroneous intervals in one iteration without intermediate processing steps. This allows for signal tracing on ATE during execution of functional tests in volume manufacturing, providing extra information for diagnosis of systemic defects. The area overhead of the proposed design-for-debug circuitry is comparable with that of the existing methods and is negligible for realistic designs.

It should be understood that the examples and embodiments described herein are for illustrative purposes only and that various modifications or changes in light thereof will be suggested to persons skilled in the art and are to be included within the spirit and purview of this application.

We claim:

1. A method for signal tracing using on-chip memory for in-system post fabrication debugging, comprising:
   receiving, at a debug module coupled to a functional bus of a system-on-chip (SoC), expected signatures and a test signal from an external automated test equipment, wherein the test signal indicates a particular trace for an error checking session, and wherein the error checking session occurs in parallel to functional testing or functional-program execution;
   receiving, at the debug module, trace data for each interval of the error checking session;
   generating a compact signature as a function of the received trace data;
   identifying whether or not the interval contains at least one erroneous trace signal by comparing the compact signature to the expected signature for that interval;
   storing intervals that contain at least one erroneous trace signal into an on-chip memory of the SoC that is coupled to the functional bus, and if the interval does not contain at least one erroneous trace signal, not storing the interval of trace data in the on-chip memory; and
   communicating the intervals that contain the at least erroneous trace signal to the external automated test equipment.

2. The method of claim 1, wherein the on-chip memory comprises at least one stack of wide I/O dynamic random access memory (DRAM).

3. The method of claim 1, wherein the on-chip memory comprises embedded DRAM.

4. The method of claim 1, further comprising temporarily storing the trace data of each interval of the error checking session in one or more buffers of the debug module during the generating of the compact signature and the identifying of whether or not the interval contains at least one erroneous trace signal.

5. The method of claim 4, wherein the one or more buffers comprise:
   a trace buffer to initially store the trace data of each interval of the error checking session; and
   a shadow buffer to receive a copy of the trace data stored in the trace buffer for the intervals containing the at least one erroneous trace signal.

6. The method of claim 5, wherein the shadow buffer has an output data bit-width different than that of the trace buffer.

7. The method of claim 1, wherein the debug module comprises control circuitry comprising a finite state machine (FSM) that schedules operations for retrieving a corresponding expected signature for each interval of the error checking session from the on-chip memory, comparing compact signatures of each interval to the corresponding expected signature for that interval, and writing trace signal data to the on-chip memory for intervals that contain the at least one erroneous trace signal, wherein the intervals not containing an erroneous trace signal are not written to the on-chip memory.

8. The method of claim 7, wherein the control circuitry further comprises a first multiple-input signature register (MISR) and a second MISR,
   wherein the first MISR and the second MISR alternatingly receive the trace data of the error checking session to generate the compact signature for a current interval and hold the compact signature from a previous interval,
   wherein the compact signature for the current interval is compared to the corresponding expected signature for that interval under the control of the FSM.

9. The method of claim 7, wherein the trace signal data comprises a time stamp and the trace data for the interval having the at least one erroneous trace signal,
   wherein the trace data for the interval having the at least one erroneous trace signal are written to the on-chip memory under the control of the FSM.

10. The method of claim 9, wherein the FSM further schedules operations for packetizing the time stamp and the trace data before writing the trace signal data to the on-chip memory.

11. The method of claim 1, wherein the error checking session is a debug session.

* * * * *